United States Patent
Li et al.

(10) Patent No.: US 10,295,586 B2
(45) Date of Patent: May 21, 2019

(54) FAULT DETECTION OF A TRANSMISSION LINE

(71) Applicant: ABB Schweiz AG, Baden (CH)

(72) Inventors: YouYi Li, Västerås (SE); Kai Liu, Beijing (CN); Jianping Wang, Västerås (SE)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 16/060,680

(22) PCT Filed: Jan. 20, 2016

(86) PCT No.: PCT/EP2016/051093
§ 371 (c)(1),
(2) Date: Jun. 8, 2018

(87) PCT Pub. No.: WO2017/125145
PCT Pub. Date: Jul. 27, 2017

(65) Prior Publication Data
US 2018/0364293 A1 Dec. 20, 2018

(51) Int. Cl.
*G01R 1/00* (2006.01)
*H02H 7/22* (2006.01)
(Continued)

(52) U.S. Cl.
CPC .......... *G01R 31/085* (2013.01); *G01R 31/08* (2013.01); *H02H 7/265* (2013.01); *G01R 1/00* (2013.01);
(Continued)

(58) Field of Classification Search
CPC ... H02J 1/00; G01R 1/00; H02M 1/00; H02H 1/00
See application file for complete search history.

(56) References Cited

U.S. PATENT DOCUMENTS 3,590,368 A * 6/1971 Esclangon ........... G01R 31/085
324/522
4,183,072 A * 1/1980 Takagi ................... H02H 7/265
361/68
(Continued)

FOREIGN PATENT DOCUMENTS

CN 101710164 A 5/2010
EP 2873982 A1 5/2015
(Continued)

OTHER PUBLICATIONS

International Search Report and Written Opinion of the International Searching Authority Application No. PCT/EP2016/051093 Completed: Apr. 20, 2016; dated Jun. 10, 2016 6 pages.
(Continued)

*Primary Examiner* — Jermele M Hollington
*Assistant Examiner* — Temilade S Rhodes-Vivour
(74) *Attorney, Agent, or Firm* — Whitmyer IP Group LLC (57) ABSTRACT

There is provided mechanisms for detecting a fault of a transmission line (20) in a power system (10) comprising at least one of an extreme weak system (10a) and an extreme strong system (10b). A method comprises obtaining travelling wave polarities from two terminals (21a, 21b) of the transmission line during occurrence of the fault, the travelling wave polarities being defined by two current polarities and two voltage polarities. The method comprises determining the obtained travelling wave polarities to be detectable and the obtained travelling wave polarities to be non-detectable. The method comprises detecting the fault to be internal based on the detectable travelling wave polarities and the non-detectable travelling wave polarities. There is also provided an arrangement configured to perform such a method.

19 Claims, 5 Drawing Sheets

(51) Int. Cl.
*H02J 1/00* (2006.01)
*G01R 31/08* (2006.01)
*H02H 7/26* (2006.01)
*H02M 1/00* (2006.01)

(52) U.S. Cl.
CPC ............... *H02H 7/22* (2013.01); *H02J 1/00* (2013.01); *H02M 1/00* (2013.01)

(56) References Cited

U.S. PATENT DOCUMENTS

| | | | |
|---|---|---|---|
| 5,572,138 A | 11/1996 | Nimmersjo | |
| 5,783,946 A * | 7/1998 | Yang | H02H 1/0092 324/509 |
| 9,007,733 B2 | 4/2015 | Wang et al. | |
| 2006/0012374 A1 | 1/2006 | Kojovic et al. | |
| 2007/0274113 A1* | 11/2007 | Wang | H02M 1/10 363/109 |
| 2011/0227581 A1 | 9/2011 | Kojovic et al. | |
| 2013/0015878 A1 | 1/2013 | Perera et al. | |
| 2016/0077149 A1* | 3/2016 | Schweitzer, III | G01R 31/2836 307/131 |
| 2017/0102444 A1* | 4/2017 | Whitehead | G01R 31/086 |

FOREIGN PATENT DOCUMENTS

| | | |
|---|---|---|
| GB | 1258427 A | 12/1971 |
| WO | 2013056144 A1 | 4/2013 |

OTHER PUBLICATIONS

M. Chamia and S. Liberman: "Ultra High Speed Relay for EHV/UHV Transmission Lines—Development, Design and Application," in IEEE Transactions on Power Apparatus and Systems, vol. PAS-97, No. 6, pp. 2104-2116, Nov. 1978.

* cited by examiner

FAULT DETECTION OF A TRANSMISSION LINE

TECHNICAL FIELD

Embodiments presented herein relate to fault categorization of a transmission line, and particularly to a method and an arrangement for fault detection of a transmission line.

BACKGROUND

Consider a regional power system having a strong internal transmission system transmitting power to another strong regional system on relatively weak Interties. Such a regional power system may experience issues with stability during disturbances, such as short circuits, loss of generation, loss of load, loss of one of the Interties, or any combination thereof. Prevalent practice to the solution of these issues is to include more Interties, increase the voltage to higher voltage levels (such as extra high voltage (EHV) levels or ultra high voltage (UHV) levels), or both. Another approach for better power system stability is to employ protection relays with high operation speed.

Travelling wave protection is one approach for super-high speed protection. There are different types of travelling wave protections, for example, travelling wave pilot protection based on directional comparison, travelling wave current differential protection, travelling wave protection based on distance measurements, etc.

In general terms, directional pilot protection enables a practical and reliable mechanism for travelling wave protection. It only needs a small bandwidth channel to transmit binary information between terminals at end points of a transmission line.

Travelling wave protection based on directional comparison has e.g., been presented in "Ultra High Speed Relay for EHV/UHV Transmission Lines'-Development, Design and Application" by M. Chamia and S. Liberman in IEEE Transactions on Power Apparatus and Systems, Vol. PAS-97, No. 6, November/December 1978. In general terms, in such protection system, the voltage and current at both ends of the protected line are measured. The direction of the local voltage and current measurements is detected. A trip decision is made based on a comparison of the directions of both ends.

Figure 1:
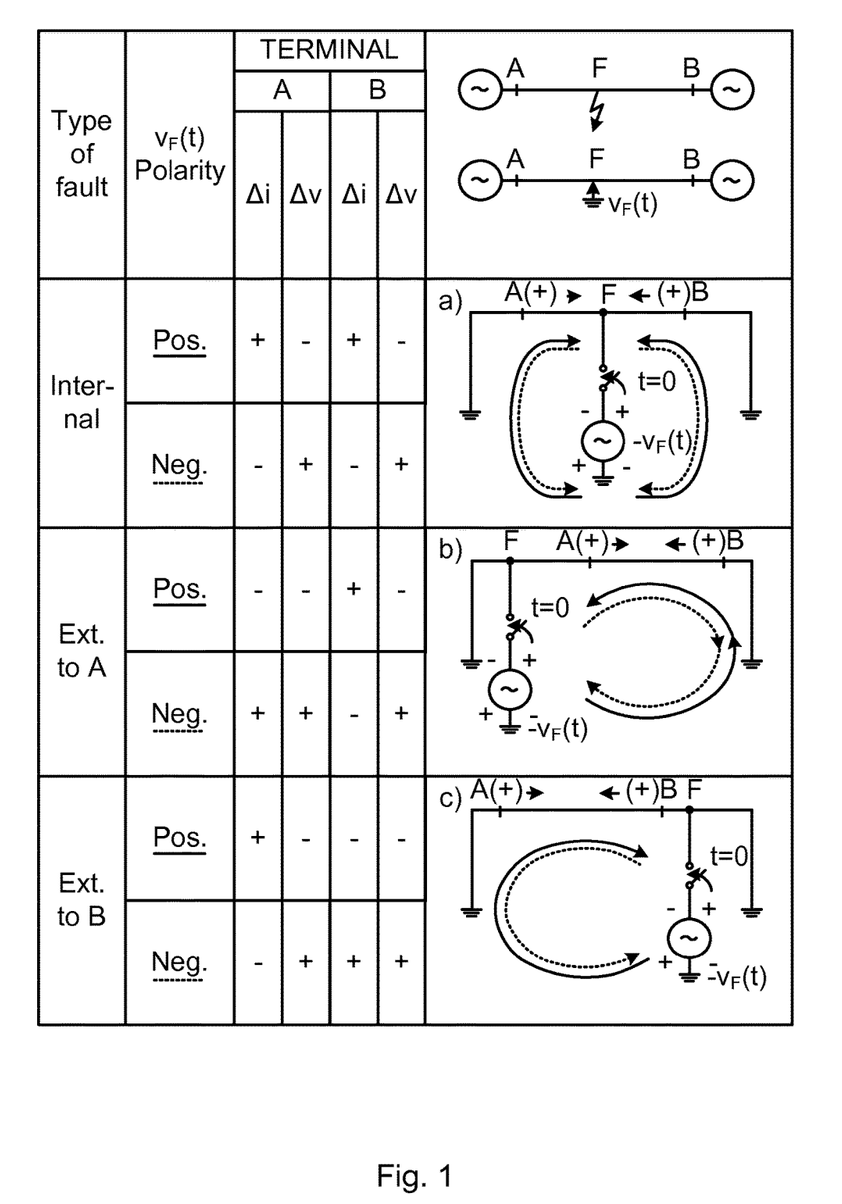
FIG. 1 is a schematic diagram illustrating principles of known travelling wave protection based on directional comparison.

In travelling wave protection based on directional comparison the polarities of the first wave fronts of local voltage and current are compared. If they are the same, a backward fault has occurred. If they are reverse, a forward fault has occurred. Then the protection relays at the two terminals will transmit the fault direction to the other terminal. If both directions are forward directions, an internal fault has occurred. Otherwise, an external fault has occurred. Its basic principle is shown in FIG. 1.

Some factors which may lead to reliability issues for known mechanism for travelling wave directional pilot protection are summarized next.

Firstly, directional pilot protection needs both voltage and current measurements on both terminals of the transmission line, which may have sensitivity issues when one of the voltage or current travelling wave is too small for polarity detection. For example, in an extreme strong system, the busbar voltage will not change during occurrence of the faults, which means the travelling wave Δu is always zero or close to zero. As a result, the directional pilot protection cannot detect the voltage polarity at the strong system side, and thereby the directional pilot protection will fail to operate.

Secondly, voltage compensation is a classical and practical way to resolve the sensitivity problem of pilot protection based on fundamental frequency values for extreme strong or weak systems. But unfortunately, this mechanism cannot be used for travelling wave protections, because the classical voltage compensation is based on fundamental frequency phasor and Ohm's law, which is not suitable for travelling wave protection based on high frequency fault transient. Some other mechanisms are needed to resolve the sensitivity problem for extreme strong or weak systems.

Hence, there is a need for improved protection of a transmission line, for example to enable improved travelling wave protection which can reduce the risk of failure of operation.

SUMMARY

An object of embodiments herein is to provide efficient protection of a transmission line in a power system.

According to a first aspect there is presented a method for detecting a fault of a transmission line in a power system comprising at least one of an extreme weak system and an extreme strong system. The method comprises obtaining travelling wave polarities from two terminals of the transmission line during occurrence of the fault, the travelling wave polarities being defined by two current polarities and two voltage polarities. The method comprises determining some of the obtained travelling wave polarities to be detectable and some of the obtained travelling wave polarities to be non-detectable. The method comprises detecting the fault to be internal based on the detectable travelling wave polarities and the non-detectable travelling wave polarities.

Advantageously this provides efficient detecting of the fault of the transmission line in a power system. In turn, this enables efficient protection of the transmission line in the power system.

Advantageously, by enabling the internal fault detection to be based on a 3-polarity comparison or a 2-polarity comparison instead of a 2-direction comparison, this enhances the sensitivity and reliability of the protection.

According to a second aspect there is presented an arrangement for detecting a fault of a transmission line in a power system comprising at least one of an extreme weak system and an extreme strong system. The arrangement comprises a processing unit. The processing unit is configured to cause the arrangement to obtain travelling wave polarities from two terminals of the transmission line during occurrence of the fault, the travelling wave polarities being defined by two current polarities and two voltage polarities. The processing unit is configured to cause the arrangement to determine some of the obtained travelling wave polarities to be detectable and some of the obtained travelling wave polarities to be non-detectable. The processing unit is configured to cause the arrangement to detect the fault to be internal based on the detectable travelling wave polarities and the non-detectable travelling wave polarities.

According to a third aspect there is presented an arrangement for detecting a fault of a transmission line in a power system comprising at least one of an extreme weak system and an extreme strong system. The arrangement comprises a communications module configured to obtain travelling wave polarities from two terminals of the transmission line during occurrence of the fault, the travelling wave polarities being defined by two current polarities and two voltage polarities. The arrangement comprises a polarity detection module configured to determine some of the obtained and the non-detectable travelling wave polarities to be detectable and some of the obtained travelling wave polarities to be non-detectable. The arrangement comprises a fault detection module configured to detect the fault to be internal based on the detectable travelling wave polarities and the non-detectable travelling wave polarities.

According to a fourth aspect there is presented a computer program for detecting a fault of a transmission line in a power system comprising at least one of an extreme weak system and an extreme strong system, the computer program comprising computer program code which, when run on a processing unit of an arrangement, causes the arrangement to perform a method according to the first aspect.

According to a fifth aspect there is presented a computer program product comprising a computer program according to the fourth aspect and a computer readable storage medium on which the computer program is stored. According to an embodiment the computer readable storage medium is a non-transitory computer readable storage medium.

It is to be noted that any feature of the first, second, third, fourth and fifth aspects may be applied to any other aspect, wherever appropriate. Likewise, any advantage of the first aspect may equally apply to the second, third, fourth, and/or fifth aspect, respectively, and vice versa. Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise to herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The inventive concept is now described, by way of example, with reference to the accompanying drawings, in which.

DETAILED DESCRIPTION

The inventive concept will now be described more fully hereinafter with reference to the accompanying drawings, in which certain embodiments of the inventive concept are shown. This inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description. Any step or feature illustrated by dashed lines should be regarded as optional.

As noted above there are issues with existing mechanisms for travelling wave protection based on directional comparison. When the power systems at the two sides of the transmission line are extreme strong or extreme weak, the related travelling wave voltages or currents may be zero or close to zero, which will make it impossible to detect the polarities of the travelling wave voltages or currents using known mechanisms for travelling wave protection. As a result, the existing travelling wave protections based on polarity comparison will fail to operate.

The herein disclosed embodiments overcome the above mentioned issues by providing travelling wave pilot protection based on information of both detectable polarities and non-detectable polarities.

Figure 2:
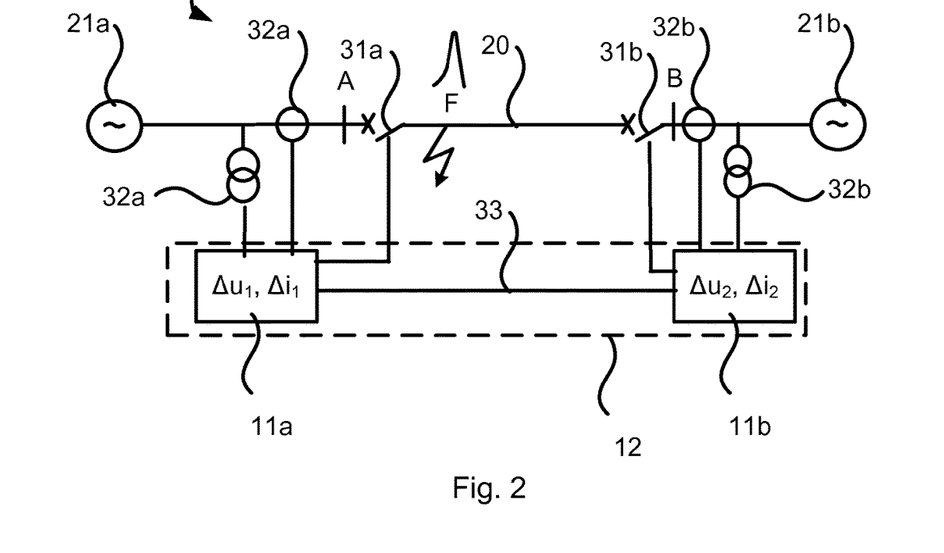
FIGS. 2, 4, and 5 are schematic diagrams illustrating travelling wave protection of a transmission line according to embodiments.

FIG. 2 schematically illustrates a power system 10 with logics of how to resolve the failure of operation under extreme system conditions according to embodiments disclosed herein. The power system 10 of FIG. 2 comprises power sources 21a, 21b, current transformers 32a, 32b, voltage transformers 32a, 32b, circuit breakers 31a, 31b, and electronic devices 11a, 11b. The electronic devices 11a, 11b are part of an arrangement 12. Two current polarities $\Delta i_1$, $\Delta i_2$ and two voltage polarities $\Delta u_1$, $\Delta u_2$ define useful information to detect fault which can be communicated via communication link 33. For a fault F in the transmission line 20 the travelling wave voltage of $\Delta u_1$ or $\Delta u_2$ may be too small in order for its polarity to be detectable if the related power system is too strong. Similarly, the travelling wave current of $\Delta i_1$ or $\Delta i_2$ may be too small in order for its polarity to be detectable if the related power system is too weak (i.e., with no load condition). Such non-detectable polarities will lead to failure of operation for the protection logic in FIG. 1.

According to embodiments disclosed herein, the zero values of voltage or current defines information being as useful as the information of detectable polarities. The electronic device 11a can be configured to send the information of $\Delta u_1$, $\Delta i_1$ to the electronic device 11b, and the electronic device 11b can be configured to send the information of $\Delta u_2$, $\Delta i_2$ to the electronic device 11a. Here, the information sent comprises polarities or statuses of zero values. Each electronic device 11a, 11b may be an intelligent electronic device (IED) operating as a relay. Embodiments of how the electronic devices 11a and 11b can detect the fault with the information of $\Delta u_1$, $\Delta i_1$, $\Delta u_2$ and $\Delta i_2$ will be provided below.

Figure 3:
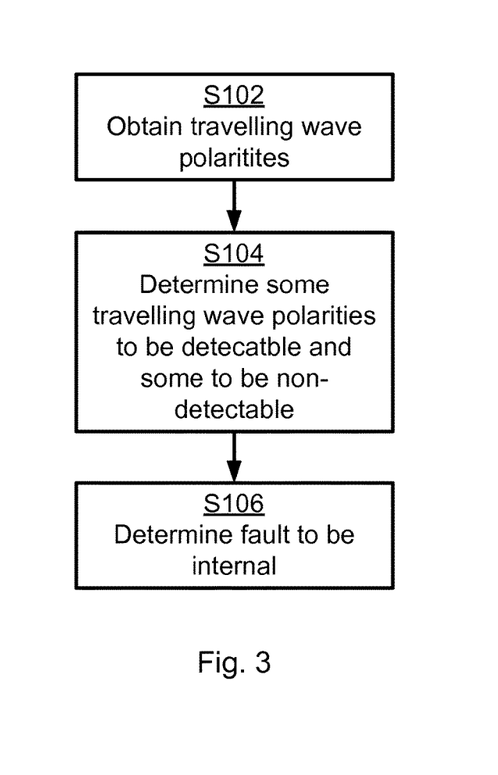
FIG. 3 is a flowchart of methods according to embodiments.

Reference is now made to the flowchart of FIG. 3 representing a method for detecting a fault F of a transmission line 20 in a power system 10 comprising at least one of an extreme weak system 10a and an extreme strong system 10a as performed by the arrangement 12 according to an embodiment.

S102: The arrangement 12 obtains travelling wave polarities from two terminals 21a, 21b of the transmission line 20 during occurrence of the fault F. The travelling wave polarities are defined by two current polarities $\Delta i_1$, $\Delta i_2$ and two voltage polarities $\Delta u_1$, $\Delta u_2$. Here, one current polarity $\Delta i_1$ and one voltage polarity $\Delta u_1$ are obtained from a first terminal 21a of the two terminals and one current polarity $\Delta i_2$ and one voltage polarity $\Delta u_2$ are obtained from a second terminal 21b of the two terminals. As will be further disclosed below, if some values of $\Delta i_1$, $\Delta i_2$, $\Delta u_1$, and $\Delta u_2$ are zero values or close to zero values, which make it impossible to detect polarities, such status of zero values is treated as useful information and can be used to detect the fault, as in step S104 below.

S104: The arrangement 12 determines some of the obtained travelling wave polarities to be detectable and some of the obtained travelling wave polarities to be non-detectable. In this respect, according to an embodiment, the obtained travelling wave polarities are non-detectable if their values are zero or close to zero, such as smaller than a threshold for reliable polarity detection. Here, the threshold can be determined by actual system conditions, for example, voltage level, measurement error, noise level, harmonics level and sampling rate etc. Further in this respect, according to an embodiment, if the voltages or currents are larger than the threshold for reliable polarity detection, the related polarities are considered detectable.

According to a first embodiment, three of the obtained travelling wave polarities are detectable and one of the obtained travelling wave polarities is non-detectable. According to a second embodiment, two of the obtained travelling wave polarities are detectable and two of the obtained travelling wave polarities are non-detectable.

S106: The arrangement 12 detects the fault F to be internal based on the detectable travelling wave polarities and the non-detectable travelling wave polarities. Specific criteria for when the fault F is detected to be internal based on the detectable travelling wave polarities and the non-detectable travelling wave polarities will be disclosed below.

Embodiments relating to further details of the herein disclosed method and arrangement for detecting a fault F of a transmission line 20 in a power system 10 comprising at least one of an extreme weak system 10a and an extreme strong system 10a will now be disclosed.

Extreme Weak System

Figure 4:
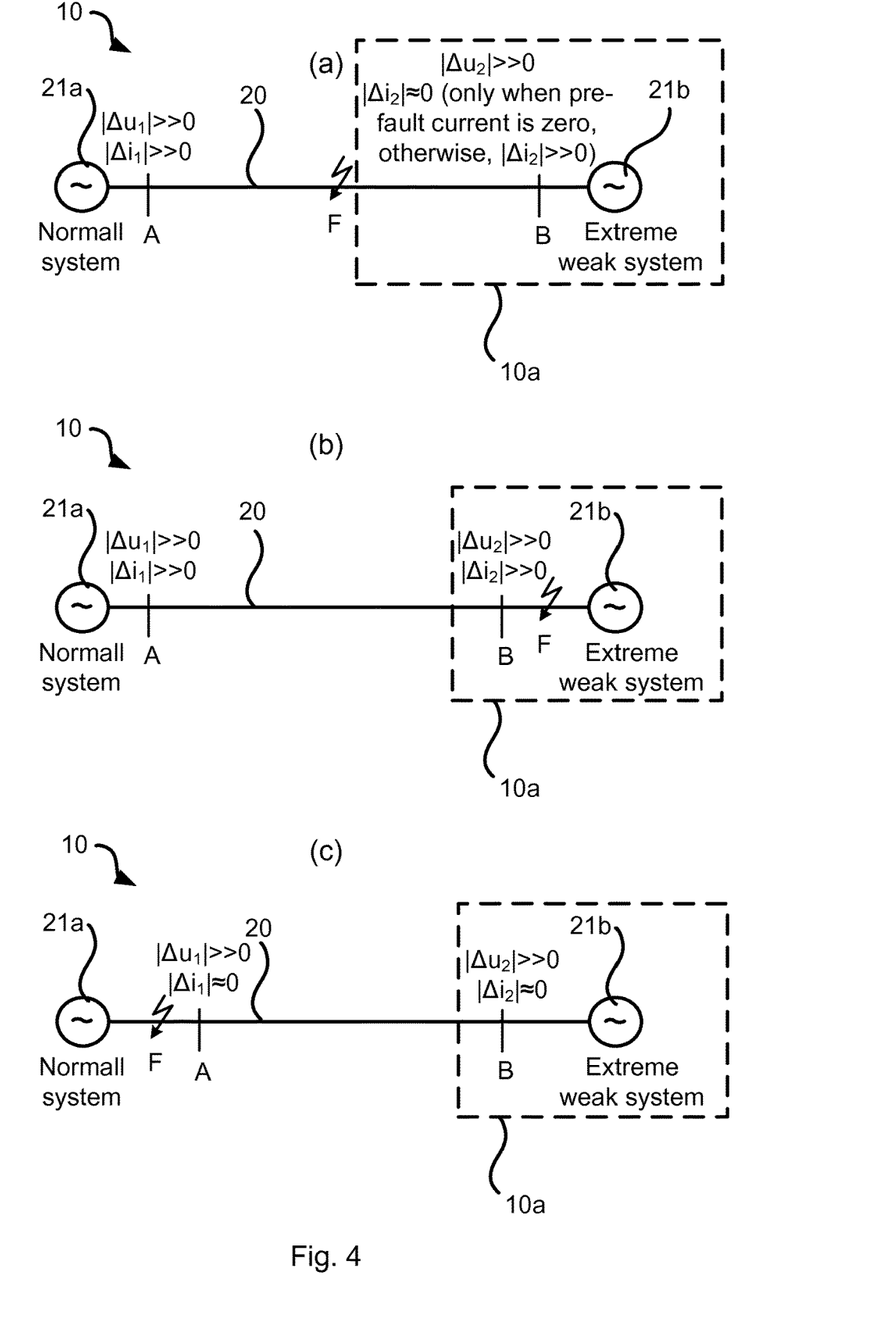

FIG. 4 at (a), (b), and (c) illustrate fault cases for a system 10 where the left side A is a normal system and the right side B is an extreme weak system 10a. At (a) there is an internal fault, at (b) there is an external fault at the extreme weak side, and at (c) there is an external fault at the normal side.

An extreme weak system (e.g. a system with a pure load without source) will lead to very small fault current at the weak side after the fault occurs, which may lead to failure of operation for classical pilot protections based on full component values.

Travelling wave protection is based on fault component values (i.e., suddenly changed values). Thereby, even when the fault current is zero at the weak side after the fault occurs, the fault component current $\Delta i$ normally is large enough for polarity detection. When and only when the pre-fault current is also zero (i.e., no load condition), the current $\Delta i$ at the weak side will be zero. The pre-fault current is zero and the fault current is zero. Thereby, the sudden change current is also zero. A summary of the polarity combinations for internal and external faults for extreme weak system with no load condition are shown in Table 1.

TABLE 1

| Fault cases | Side A | | Side B | |
|---|---|---|---|---|
| | $\Delta u_1$ | $\Delta i_1$ | $\Delta u_2$ | $\Delta i_2$ |
| Internal faults | + | − | + | o |
| | − | + | − | o |
| External faults | + | − | + | + |

TABLE 1-continued

| Fault cases | Side A | | Side B | |
|---|---|---|---|---|
| | $\Delta u_1$ | $\Delta i_1$ | $\Delta u_2$ | $\Delta i_2$ |
| at weak side | − | + | − | − |
| External faults | + | o | + | o |
| at normal side | − | o | − | o |

Criteria for Internal Fault in an Extreme Weak System

The criteria for detecting the fault as an internal fault in an extreme weak system follows from Table 1; the fault is an internal fault if the voltage polarities detected at both terminals are the same and for the two currents detected at both terminals one is zero and the other has the different polarity from the two voltages. Otherwise, the fault is an external fault. Hence, according to an embodiment, if the voltage polarities ($\Delta u_1$, $\Delta u_2$) detected at both terminals 21a, 21b are equal, and for the two current polarities ($\Delta i_1$, $\Delta i_2$) detected at both terminals 21a, 21b one is zero and the other has different polarity from the two voltage polarities ($\Delta u_1$, $\Delta u_2$), the system is an extreme weak system and the fault F is detected as internal, and otherwise, the fault F is detected as external. The criteria can be described by the equations below:

$$\text{Internal fault:} \begin{cases} \Delta u_1 \cdot \Delta u_2 > 0 \\ \Delta u_1 \cdot \Delta i_1 < 0 \\ |\Delta i_2| \approx 0 \end{cases}$$

Extreme Strong System

Figure 5:
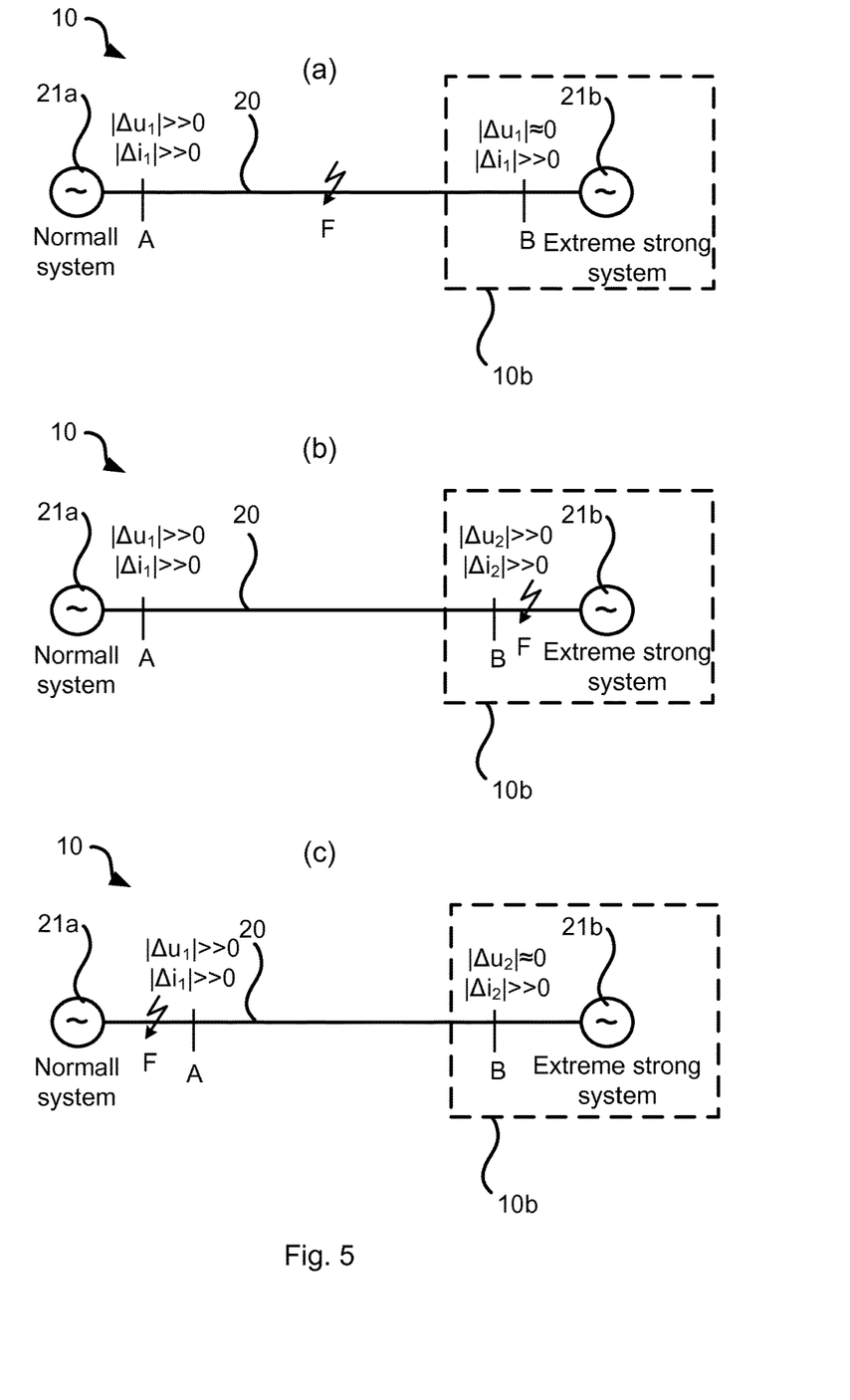

FIG. 5 at (a), (b), and (c) illustrate fault cases for a system 10 where the left side A is a normal system and the right side B is an extreme strong system 10a. At (a) there is an internal fault, at (b) there is an external fault at the extreme strong side, and at (c) there is an external fault at the normal side.

In fault cases for an extreme strong system the busbar voltage will always be kept on the rated voltage level. This means that the fault component voltage $\Delta u_2$ is almost zero when the fault occurs.

It is not possible to detect the polarity of the voltage travelling wave directly at the strong system side. As a result, known directional travelling wave pilot protection mechanisms will fail to operate. A summary of the polarity combinations for internal and external faults are shown in Table 2.

TABLE 2

| Fault cases | Side A | | Side B | |
|---|---|---|---|---|
| | $\Delta u_1$ | $\Delta i_1$ | $\Delta u_2$ | $\Delta i_2$ |
| Internal faults | + | − | o | − |
| | − | + | o | + |
| External faults | + | − | + | + |
| at strong side | − | + | − | − |
| External faults | +* | + | o | − |
| at normal side | −* | − | o | + |

*For the external faults at the normal side, the travelling wave voltage (i.e., voltage polarity) at the normal side may be zero in some cases, such as if the transmission line is short and the external fault location is far away from the busbar at the normal side.

Criteria for Internal Fault in an Extreme Strong System

The criteria for detecting the fault as an internal fault in an extreme strong system follows from Table 2; the fault is an internal fault if the current polarities detected at both terminals are the same and for the two voltages detected at both terminals one is zero and the other has the different polarity from the two currents. Otherwise, the fault is an external fault. Hence, according to an embodiment, if the current polarities $\Delta i_1$, $\Delta i_2$ detected at both terminals 21a, 21b are equal, and for the two voltage polarities $\Delta u_1$, $\Delta u_2$ detected at both terminals 21a, 21b one is zero and the other has different polarity from the two current polarities, the system is an extreme strong system and the fault F is categorized as internal, and otherwise, the fault F is categorized as external. The criteria can be described by the equations below:

$$\text{Internal fault} \begin{cases} \Delta i_1 \cdot \Delta i_2 > 0 \\ \Delta u_1 \cdot \Delta i_1 < 0 \\ |\Delta u_2| \approx 0 \end{cases}$$

Common Criteria for Both Extreme Strong and Weak Systems

The fault criteria for the extreme strong and the fault criteria for the extreme weak systems can be described into common criteria as shown below.

For a transmission line system with two terminals, there are four travelling wave polarities; two current polarities $\Delta i_1$, $\Delta i_2$ and two voltage polarities $\Delta u_1$, $\Delta u_2$. If one of the polarities cannot be detected this means that the value of this polarity is close to zero. This means an extreme system condition (where if one voltage polarity is close to zero there is an extreme strong system, and where if one current polarity is close to zero there is an extreme weak system). Hence, there are only three polarities available for fault detection; either two voltage polarities and one current polarity or one voltage polarity and two current polarities. In this case, the fault is an internal fault if two current polarities are the same or two voltage polarities are the same and the other available polarity is opposite. Otherwise, the fault is an external fault. Hence, according to an embodiment, the fault F is detected as internal if the two current polarities $\Delta i_1$, $\Delta i_2$ are equal or the two voltage polarities $\Delta u_1$, $\Delta u_2$ are equal, and the detectable polarities at first terminal of the two terminals 21a, 21b are mutually opposite each other. The criteria can be described by the equations below:

$$\text{Internal fault} \begin{cases} \Delta u_1 \cdot \Delta u_2 > 0 \\ \Delta u_1 \cdot \Delta i_1 < 0 \\ |\Delta i_2| \approx 0 \end{cases} \text{ or } \begin{cases} \Delta i_1 \cdot \Delta i_2 > 0 \\ \Delta u_1 \cdot \Delta i_1 < 0 \\ |\Delta u_2| \approx 0 \end{cases}$$

Combination of Extreme Strong System and Extreme Weak System

Consider now a combination of one extreme strong system 10b and one extreme weak system 10a with no load condition; i.e., a system 10 where one side is an extreme strong system 10b and the other side is an extreme weak system 10b. Assume further that the polarities $\Delta u_1$ and $\Delta i_1$ are measured at the extreme strong side and that the polarities $\Delta u_2$ and $\Delta i_2$ are measured at the extreme weak side. If there is an internal fault, the travelling waves at the strong side are $\Delta u_1 \approx 0$ and $|\Delta i_1| \gg 0$; while if there is an internal fault, the travelling waves at the weak side are $|\Delta u_2| \gg 0$ and $|\Delta i_2| \approx 0$. A summary of the polarity combinations for internal and external faults are shown in Table 3.

TABLE 3

|  | Side A (strong) | | Side B (weak) | |
| --- | --- | --- | --- | --- |
| Fault cases | $\Delta u1$ | $\Delta i1$ | $\Delta u2$ | $\Delta i2$ |
| Internal faults | o | − | + | o |
|  | o | + | − | o |
| External faults at weak side | o | − | +* | + |
|  | o | + | −* | − |
| External faults at strong side | + | o | + | o |
|  | − | o | − | o |

*For the external faults at the weak side, the travelling wave voltage (i.e., voltage polarity) at the weak side may be zero in some cases, such as if the transmission line is short and the fault location is far away from the busbar at the weak side.

Criteria for Internal Fault

The criteria for detecting the fault as an internal fault in system 10 comprising a combination of one extreme strong system 10b and one extreme weak system 10a follows from Table 3; the fault is an internal fault if the travelling wave current (i.e., current polarity) at one side is zero, the travelling wave voltage (i.e., voltage polarity) at the other side is zero, and the rest one available current polarity and one available voltage polarity have mutually opposite polarities. Hence, according to an embodiment the fault F is detected as internal if the voltage polarity $\Delta u_1$ at a first terminal 21a of the two terminals 21a, 21b is zero, the current polarity $\Delta i_2$ at a second terminal 21b of the two terminals 21a, 21b is zero, and the detectable voltage polarity $\Delta u_2$ and one detectable current polarity $\Delta i_1$ are mutually opposite each other. The criteria can be described by the equations below:

$$\text{Internal fault} \begin{cases} \Delta i_1 \cdot \Delta u_2 < 0 \\ |\Delta u_1| \approx 0 \\ |\Delta i_2| \approx 0 \end{cases}$$

It should be noted that the strong or weak systems as mentioned herein only imply extreme system conditions where $\Delta i \approx 0$ or $\Delta u \approx 0$ during occurrence of the fault s. This makes it difficult to obtain the travelling wave polarity detection according to prior art.

There may be different types of transmission lines 20 to which the herein fault detection can be applied. For example, the transmission line 20 may be part of a power distribution system. The transmission line 20 may either be an alternating current (AC) transmission line or a direct current (DC) transmission line.

Figure 6A:
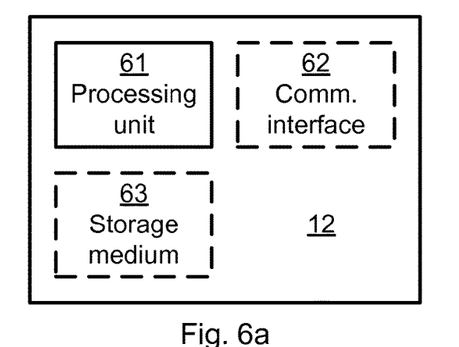
FIG. 6a is a schematic diagram showing functional units of an arrangement according to an embodiment.

FIG. 6a schematically illustrates, in terms of a number of functional units, the components of an arrangement 12 for detecting a fault F of a transmission line 20 in a power system 10 comprising at least one of an extreme weak system 10a and an extreme strong system 10a according to an embodiment. A processing unit 61 is provided using any combination of one or more of a suitable central processing unit (CPU), multiprocessor, microcontroller, digital signal processor (DSP), application specific integrated circuit (ASIC), field programmable gate arrays (FPGA) etc., capable of executing software instructions stored in a computer program product 71 (as in FIG. 7), e.g. in the form of a storage medium 63. Thus the processing unit 61 is thereby arranged to execute methods as herein disclosed. The storage medium 63 may also comprise persistent storage, which, for example, can be any single one or combination of magnetic memory, optical memory, solid state memory or even remotely mounted memory. The arrangement 12 may further comprise a communications interface 62. As such the communications interface 62 may comprise one or more transmitters and receivers, comprising analogue and digital components. The processing unit 61 controls the general operation of the arrangement 12 e.g. by sending data and control signals to the communications interface 62 and the storage medium 63, by receiving data and reports from the communications interface 62, and by retrieving data and instructions from the storage medium 63. Other components, as well as the related functionality, of the arrangement 12 are omitted in order not to obscure the concepts presented herein.

The arrangement 12 may be implemented in the electronic devices 11*a*, 11*b*. Hence, the electronic devices 11*a*, 11*b* may be configured to perform any step as herein disclosed. For example, each electronic device 11*a*, 11*b* may be configured to acquire information of both voltage and current polarities from its own (i.e., local) end and to acquire information of both voltage and current polarities from the other (i.e., remote) end from the other electronic device (over the communication link 33) in order to compare the voltage and current polarities in order to categorize the fault F of the transmission line 20. Alternatively, the arrangement 12 is provided as a standalone device which interfaces the electronic devices 11*a*, 11*b* and where the standalone device is configured to acquire information from both ends of the transmission line in order to compare the voltage and current polarities to categorize the fault F of the transmission line 20.

Figure 6B:
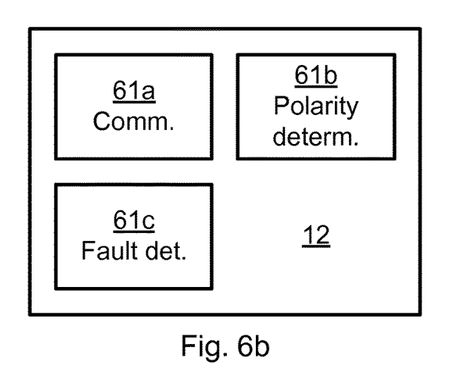
FIG. 6b is a schematic diagram showing functional modules of a protection device according to an embodiment.

FIG. 6*b* schematically illustrates, in terms of a number of functional modules, the components of an arrangement 12 embodied as a protection device according to an embodiment. The arrangement 12 of FIG. 6*b* comprises a number of functional modules; a communications module 61*a*, a polarity determination module 61*b*, and a fault detection module 61*c*.

The communications module 61*a* is configured to receive the polarities of voltages and currents from the local end of the transmission line 20 as well as from the remote end of the transmission line 20. The communications module 61*a* is thereby configured to obtain travelling wave polarities from two terminals 21*a*, 21*b* of the transmission line 20 during occurrence of the fault F, where the travelling wave polarities are defined by two current polarities $\Delta i_1$, $\Delta i_2$ and two voltage polarities $\Delta u_1$, $\Delta u_2$. Here, the polarity information may be detectable (i.e., either positive or negative) or non-detectable. The communications module 61*a* can further be configured to send the polarity information of voltages and currents from the local end of the transmission line 20 to the remote end of the transmission line 20.

The polarity determination module 61*b* is configured to determine some of the obtained travelling wave polarities to be detectable and some of the obtained travelling wave polarities to be non-detectable.

The fault detection module 61*c* implements logic to categorize the fault based on any of the herein disclosed embodiments. Particularly, the fault detection module 61*c* is configured to categorize the fault F to be internal based on the three detectable travelling wave polarities and the non-detectable travelling wave polarity.

In general terms, each functional module 61*a-c* may be implemented in hardware or in software. Preferably, one or more or all functional modules 61*a-c* may be implemented by the processing unit 61, possibly in cooperation with functional units 62 and/or 63. The processing unit 61 may thus be arranged to from the storage medium 63 fetch instructions as provided by a functional modules 61*a-c* and to execute these instructions, thereby performing any steps as disclosed herein.

Figure 7:
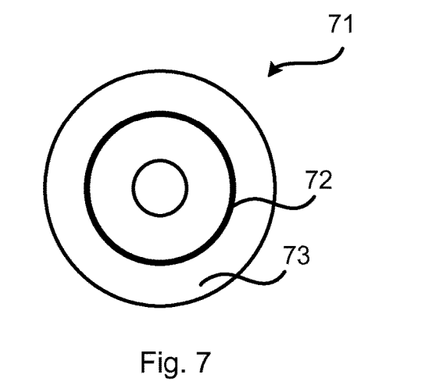
FIG. 7 shows one example of a computer program product comprising computer readable means according to an embodiment.

FIG. 7 shows one example of a computer program product 71 comprising computer readable means 73. On this computer readable means 73, a computer program 72 can be stored, which computer program 72 can cause the processing unit 61 and thereto operatively coupled entities and devices, such as the communications interface 62 and the storage medium 63, to execute methods according to embodiments described herein. The computer program 72 and/or computer program product 71 may thus provide means for performing any steps as herein disclosed.

In the example of FIG. 7, the computer program product 71 is illustrated as an optical disc, such as a CD (compact disc) or a DVD (digital versatile disc) or a Blu-Ray disc. The computer program product 71 could also be embodied as a memory, such as a random access memory (RAM), a read-only memory (ROM), an erasable programmable read-only memory (EPROM), or an electrically erasable programmable read-only memory (EEPROM) and more particularly as a non-volatile storage medium of a device in an external memory such as a USB (Universal Serial Bus) memory or a Flash memory, such as a compact Flash memory. Thus, while the computer program 72 is here schematically shown as a track on the depicted optical disk, the computer program 72 can be stored in any way which is suitable for the computer program product 71.

The inventive concept has mainly been described above with reference to a few embodiments. However, as is readily appreciated by a person skilled in the art, other embodiments than the ones disclosed above are equally possible within the scope of the inventive concept, as defined by the appended patent claims.

The invention claimed is:

1. A method for detecting a fault of a transmission line in a power system comprising at least one of an extreme weak system and an extreme strong system, the method comprising:
    obtaining travelling wave polarities from two terminals of the transmission line during occurrence of the fault, the travelling wave polarities being defined by two current polarities ($\Delta i_1$, $\Delta i_2$) and two voltage polarities ($\Delta u_1$, $\Delta u_2$);
    determining some of the obtained travelling wave polarities to be detectable and some of the obtained travelling wave polarities to be non-detectable; and
    detecting the fault to be internal based on the detectable travelling wave polarities and the non-detectable travelling wave polarities.

2. The method according to claim 1, wherein said obtained travelling wave polarities are non-detectable if their values are zero or close to zero.

3. The method according to claim 1, wherein said obtained travelling wave polarities are detectable if their values are reliably detectable.

4. The method according to claim 1, wherein the fault is detected as internal if the two current polarities ($\Delta i_1$, $\Delta i_2$) are equal or the two voltage polarities ($\Delta u_1$, $\Delta u_2$) are equal, and the detectable polarities at first terminal of said two terminals are mutually opposite each other.

5. The method according to claim 1, wherein the fault is detected as internal if $$\begin{cases} \Delta u_1 \cdot \Delta u_2 > 0 \\ \Delta u_1 \cdot \Delta i_1 < 0 \\ |\Delta i_2| \approx 0 \end{cases} \text{ or } \begin{cases} \Delta i_1 \cdot \Delta i_2 > 0 \\ \Delta u_1 \cdot \Delta i_1 < 0 \\ |\Delta u_2| \approx 0 \end{cases}.$$

6. The method according to claim 1, wherein the fault is detected as internal if the voltage polarity ($\Delta u_1$) at a first terminal of said two terminals is zero, the current polarity ($\Delta i_2$) at a second terminal of said two terminals is zero, and the detectable voltage polarity ($\Delta u_2$) and one detectable current polarity ($\Delta i_1$) are mutually opposite each other.

7. The method according to claim 1, wherein the fault is detected as internal if $$\begin{cases} \Delta i_1 \cdot \Delta u_2 < 0 \\ |\Delta u_1| \approx 0 \\ |\Delta i_2| \approx 0 \end{cases}.$$

8. The method according to claim 1, wherein, if the voltage polarities ($\Delta u_1$, $\Delta u_2$) detected at both terminals are equal, and for the two current polarities ($\Delta i$, $\Delta i_2$) detected at both terminals one is zero and the other has different polarity from the two voltage polarities ($\Delta u_1$, $\Delta u_2$), the system is an extreme weak system and the fault is detected as internal, and otherwise, the fault is detected as external.

9. The method according to claim 1, wherein the fault is detected as internal in the extreme weak system if $$\begin{cases} \Delta u_1 \cdot \Delta u_2 > 0 \\ \Delta u_1 \cdot \Delta i_1 < 0 \\ |\Delta i_2| \approx 0 \end{cases}.$$

10. The method according to claim 1, wherein, if the current polarities ($\Delta i_1$, $\Delta i_2$) detected at both terminals are equal, and for the two voltage polarities ($\Delta u_1$, $\Delta u_2$) detected at both terminals one is zero and the other has different polarity from the two current polarities, the system is an extreme strong system and the fault is detected as internal, and otherwise, the fault is detected as external.

11. The method according to claim 1, wherein the fault is detected as internal in the extreme strong system if $$\begin{cases} \Delta i_1 \cdot \Delta i_2 > 0 \\ \Delta u_1 \cdot \Delta i_1 < 0 \\ |\Delta u_2| \approx 0 \end{cases}.$$

12. The method according to claim 1, wherein the transmission line is part of a power distribution system.

13. The method according to claim 1, wherein the transmission line is an AC transmission line.

14. The method according to claim 1, wherein the transmission line is a DC transmission line.

15. The method according to claim 1, wherein three of the obtained travelling wave polarities are detectable and one of the obtained travelling wave polarities is non-detectable.

16. The method according to claim 1, wherein two of the obtained travelling wave polarities are detectable and two of the obtained travelling wave polarities are non-detectable.

17. The method according to claim 1, wherein the step of detecting comprises categorizing the fault as being internal versus external based on the detectable travelling wave polarities and the non-detectable travelling wave polarities.

18. An arrangement for detecting a fault of a transmission line in a power system comprising at least one of an extreme weak system and an extreme strong system, the arrangement comprising a processing unit, the processing unit being configured to cause the arrangement to:
   obtain travelling wave polarities from two terminals of the transmission line during occurrence of the fault, the travelling wave polarities being defined by two current polarities ($\Delta i_1$, $\Delta i_2$) and two voltage polarities ($\Delta u_1$, $\Delta u_2$);
   determine some of the obtained travelling wave polarities to be detectable and some of the obtained travelling wave polarities to be non-detectable; and
   detect the fault to be internal based on the detectable travelling wave polarities and the non-detectable travelling wave polarities.

19. An arrangements for detecting a fault of a transmission line in a power system comprising at least one of an extreme weak system and an extreme strong system, the arrangement comprising:
   a communications module configured to obtain travelling wave polarities from two terminals of the transmission line during occurrence of the fault, the travelling wave polarities being defined by two current polarities ($\Delta i_1$, $\Delta i_2$) and two voltage polarities ($\Delta u_1$, $\Delta u_2$);
   a polarity detection module configured to determine some of the obtained travelling wave polarities to be detectable and some of the obtained travelling wave polarities to be non-detectable; and
   a fault detection module configured to detect the fault to be internal based on the detectable travelling wave polarities and the non-detectable travelling wave polarities.

* * * * *